(12) United States Patent
Choi et al.

(10) Patent No.: US 10,558,303 B2
(45) Date of Patent: Feb. 11, 2020

(54) TOUCH SENSOR AND MANUFACTURING METHOD THEREOF

(71) Applicant: Samsung Display Co., Ltd., Yongin-si (KR)

(72) Inventors: Won Il Choi, Yongin-si (KR); Je Won Yoo, Yongin-si (KR); Jong Ho Hong, Yongin-si (KR); Hye Jin Joo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 482 days.

(21) Appl. No.: 15/072,958

(22) Filed: Mar. 17, 2016

(65) Prior Publication Data

US 2017/0060299 A1    Mar. 2, 2017

(30) Foreign Application Priority Data

Aug. 28, 2015  (KR) ........................ 10-2015-0121938

(51) Int. Cl.
*G06F 3/044* (2006.01)
*H05K 1/02* (2006.01)
*H05K 1/03* (2006.01)
*H05K 1/09* (2006.01)
*H05K 3/10* (2006.01)

(52) U.S. Cl.
CPC ........... *G06F 3/044* (2013.01); *H05K 1/0283* (2013.01); *H05K 1/0298* (2013.01); *H05K 1/0326* (2013.01); *H05K 1/0346* (2013.01); *H05K 1/09* (2013.01); *H05K 3/101* (2013.01); *H05K 3/107* (2013.01); *G06F 2203/04103* (2013.01)

(58) Field of Classification Search
CPC ...... G06F 3/044; H05K 1/0283; H05K 3/107; H05K 1/0272
See application file for complete search history.

(56) References Cited

U.S. PATENT DOCUMENTS

2012/0075243 A1* 3/2012 Doi ....................... G06F 3/0416
                                                                    345/174
2013/0271159 A1   10/2013 Santos et al.
(Continued)

FOREIGN PATENT DOCUMENTS

| KR | 10-2015-0103777 | 9/2015 |
| KR | 10-2016-0028568 | 3/2016 |
| WO | 20140163374     | 10/2014 |

OTHER PUBLICATIONS

The Extended European Search Report dated Jun. 6, 2017, issued in European Patent Application No. 16182915,5.
(Continued)

*Primary Examiner* — Kent W Chang
*Assistant Examiner* — Chayce R Bibbee
(74) *Attorney, Agent, or Firm* — H.C. Park & Associates, PLC

(57) ABSTRACT

A touch sensor including a first substrate which extends in a first direction and on which first channels may be formed and stretched, a first conductive liquid injected into the first channels, a second substrate which extends in a second direction which intersects with the first direction and on which second channels may be formed and stretched, and a second conductive liquid injected into the second channels.

18 Claims, 11 Drawing Sheets

(56) References Cited

U.S. PATENT DOCUMENTS

| | | | | |
|---|---|---|---|---|
| 2013/0312541 A1* | 11/2013 | Majidi | ............... | G01B 7/18 |
| | | | | 73/862.454 |
| 2014/0152611 A1 | 6/2014 | Yairi et al. | | |
| 2014/0238153 A1* | 8/2014 | Wood | ............... | G06F 3/011 |
| | | | | 73/862.627 |
| 2015/0130754 A1* | 5/2015 | Yairi | ............... | G06F 3/044 |
| | | | | 345/174 |
| 2015/0248179 A1 | 9/2015 | Ahn | | |
| 2016/0066411 A1 | 3/2016 | Hong et al. | | |

OTHER PUBLICATIONS

Ruben D Ponce Wong et al., "Flexible microfluidic normal force sensor skin for tactile feedback", Sensors and Actuators A: Physical, Elsevier BV, NL, vol. 179, Mar. 14, 2012, XP028420928, pp. 62-69.

Fassler A et al., "Soft-matter capacitors and inductors for hyperelastic strain sensing and stretchable electronics", Smart Materials and Structures, IOP Publishing Ltd., Bristol, GB, vol. 22. No. 5, Apr. 11, 2013, XP020244281, p. 55023.

Arya Tabatabai et al,, "Liquid-Phase Gallium-indium Alloy Electronics with Microcontact Printing", Langmui R, vol. 29, No. 20, May 21, 2013, XP055335574, pp. 6194-6200.

Hyung Jun Koo et al., "Towards All-Soft Matter Circuits: Prototypes of Quasi-Liquid Devices with Memristor Characteristics", Advanced Materials, vol. 23, No. 31, Jul. 4, 2011, XP055375935, pp. 3559-3564.

Partial European Search Report dated Jan. 26 2017, in European Patent Application No. 16182915.5.

Mitsuhiro Shikida et al., "A Flexible Transparent Touch Panel Based on Ionic Liquid Channel", IEEE Sensors Journal, IEEE Service Center, New York, NY, US, vol. 13, No. 9, Sep. 1, 2013, XP011523486, pp. 3490-3495.

Yong-Lae Park et al., "Design and Fabrication of Soft Artificial Skin Using Embedded Microchannels and Liquid Conductors", IEEE Sensor Journal, IEEE Service Center, New York, NY, US, vol. 12, No. 8, Aug. 1, 2012, XP01147337, pp. 2711-2718.

\* cited by examiner

TOUCH SENSOR AND MANUFACTURING METHOD THEREOF

CROSS-REFERENCE TO RELATED APPLICATION

This application claims priority from and the benefit of Korean Patent Application No. 10-2015-0121938, filed on Aug. 28, 2015, which is hereby incorporated by reference for all purposes as if fully set forth herein.

BACKGROUND

Field

Exemplary embodiments relate to a touch sensor and a manufacturing method thereof.

Discussion of the Background

A touch sensor is an input device which, when touched by a human hand or an object, is capable of recognizing the location of the touch. Along with the advances in the development of smart devices, the usage and requirements for touch sensors are on the rise.

Recently studies have been underway on flexible displays and stretchable displays. A stretchable touch sensor capable of being used as an interface for a stretchable display has also been under development.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide to a touch sensor and a method of manufacturing the same which form channels that cross each other on a stretchable substrate, where each of the channels includes a wedge having a round form. Because conductive liquid is injected into the channel, touch sensitivity may increase as a result of the wedge. In addition, because there are no bubbles in the channel, damage to the substrate may be prevented.

Additional aspects will be set forth in the detailed description which follows, and, in part, will be apparent from the disclosure, or may be learned by practice of the inventive concept.

An exemplary embodiment discloses a touch sensor including a stretchable first substrate having first channels extended in a first direction, a first conductive liquid injected into the first channels, a second stretchable substrate having second channels extended in a second direction crossing the first direction, and a second conductive liquid injected into the second channels.

An exemplary embodiment also discloses a method for manufacturing a touch sensor including forming a first groove-formed substrate having first grooves, forming a first flat substrate, forming a first substrate having first channels corresponding to the first groove by attaching the first groove-formed substrate and the first flat substrate, and injecting a first conductive liquid into the first channels.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
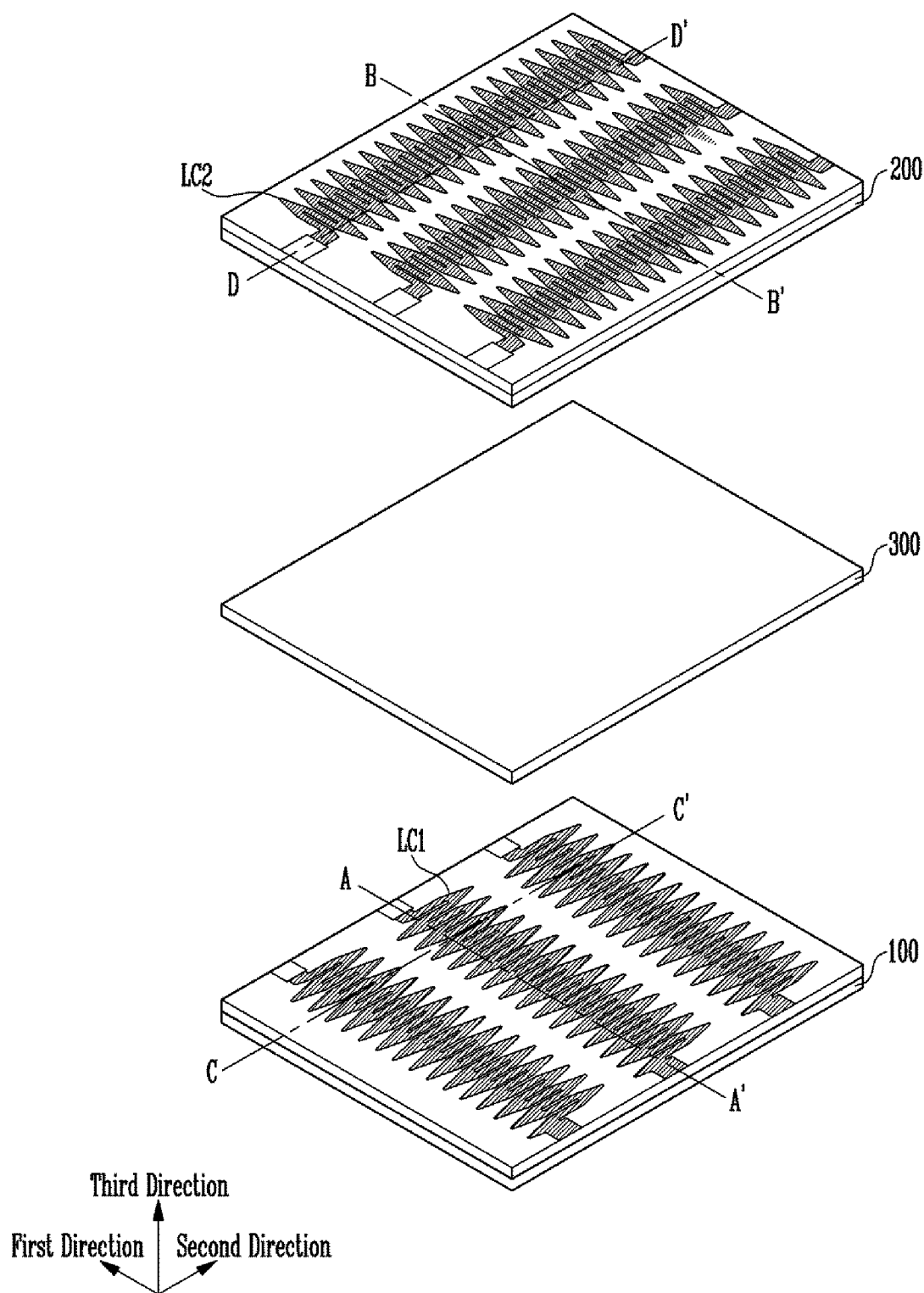
FIG. 1, FIG. 2, and FIG. 3 are a perspective exploded view and two cross-sectional views illustrating a touch sensor in accordance with an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
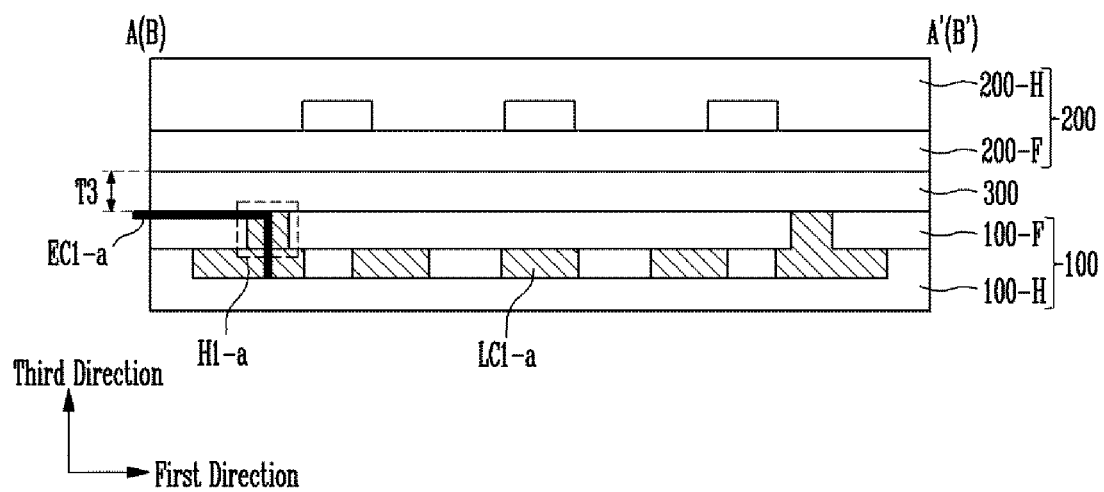
Figure 3:
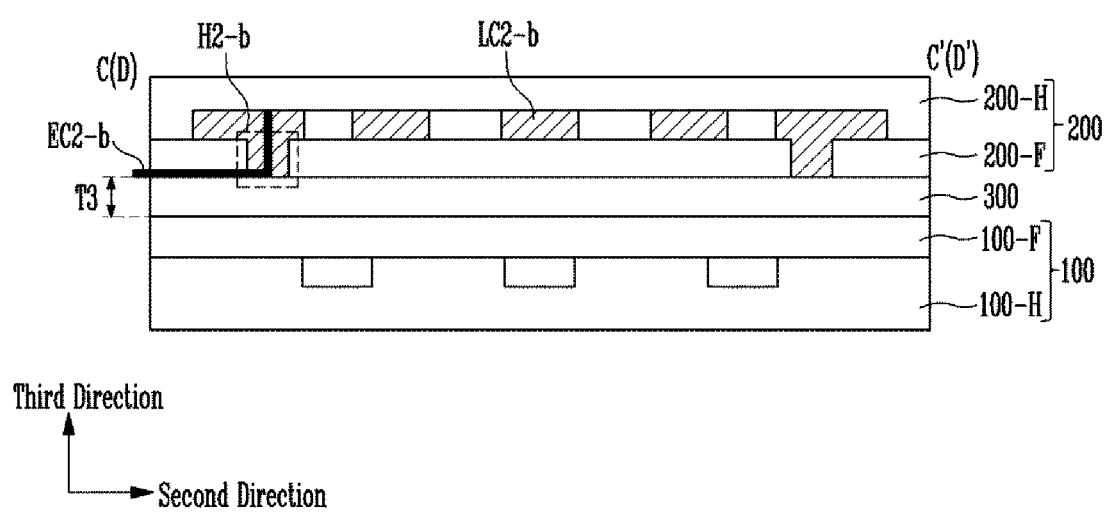

FIGS. 1 to 3 are an exploded perspective view and two cross-sectional views illustrating a touch sensor in accordance with an exemplary embodiment. FIG. 1 is an exploded perspective view illustrating the touch sensor; FIG. 2 is a cross-sectional view illustrating the touch sensor viewed along section lines A-A' and B-B' of FIG. 1; and FIG. 3 is a cross-sectional view illustrating the touch sensor viewed along section lines C-C' and D-D'.

Referring to FIG. 1, the touch sensor may include a first substrate 100, a second substrate 200, and a third substrate 300. The first substrate 100, the second substrate 200, and the third substrate 300 may have a thickness in the direction of a third direction which crosses both a first direction and a second direction. The first substrate 100, the second substrate 200, and the third substrate 300 are separately described for ease of illustration, but in fact, the first substrate 100 and the third substrate may be adhered together, and the third substrate 300 and the second substrate may be adhered together. The first substrate 100 may include first channels LC1 extending in the first direction, and a first conductive liquid may be inserted into the first channels LC1. The second substrate 200 may include second channels LC2 extending in the second direction crossing the first direction, and second conductive liquid may be inserted into the second channels LC2. The third substrate 300 may be located between the first substrate 100 and the second substrate 200. The first substrate 100 and the third substrate 300 may be adhered together, and the third substrate 300 and the second substrate 200 may be adhered together. The first substrate 100, the second substrate 200, and the third substrate 300 may all be stretchable, and in accordance with an exemplary embodiment, the elastic modulus of the third substrate 300 may be lower than those of the first substrate 100 and the second substrate 200. Alternatively, the material making up the first substrate 100, the second substrate 200, and the third substrate 300 may be the same, and the elastic moduli of the first substrate 100, the second substrate 200, and the third substrate 300 may all be the same. The material making up at least one among the first substrate 100 to the third substrate 300 may include at least one of the groups made up of polydimethylsiloxame (PDMS) or polyurethane, so the first substrate 100, the second substrate 200, and the third substrate 300 may all be stretchable. Material making up at least one of the first conductive liquid or the second conductive liquid may include at least one from the group consisting of gallium (Ga) and indium (In). Particularly, if a eutectic gallium-indium alloy (Eutectic Ga—In, EGaIn), which is an alloy of eutectic method of gallium (Ga) and indium (In), is used, a liquid state with low resistivity may be maintained at room temperature because the melting point of the alloy is lower than room temperature, making possible its use as the first conductive liquid or the second conductive liquid.

The first substrate 100, the second substrate 200, and the third substrate 300 will be explained in more detail with reference to FIGS. 2 and 3. The first substrate 100 may include a first groove-formed substrate 100-H and a first flat substrate 100-F, and the second substrate 200 may include a second groove-formed substrate 200-H and a second flat substrate 200-F.

Referring to FIG. 2, first grooves may be formed on the first groove-formed substrate 100-H. A detailed explanation of the first groove-formed substrate 100-H will be given with reference to FIG. 9. The first flat substrate 100-F may be adhered to the first groove-formed substrate 100-H so that the first grooves are blocked from outside, and first holes may be formed on the first flat substrate 100-F. First electrodes may be inserted into the first holes. For ease of illustration, it may be assumed that the actual locations of A and A' within the device correspond to the locations of B and B', and that only $a^{th}$ (where a is a natural number) first channel LC1-*a* among all first channels are shown here. Therefore, in FIG. 2, a first hole H1-*a* among all the first holes is shown as a representative of the first holes, and a first electrode EC1-*a* among all the first electrodes are shown as a representative of the first electrodes. The first electrode EC1-*a* may be arranged between the first flat substrate 100-F and the third substrate 300. When the touch sensor is driven, at least one of the first electrodes, for example the first electrode EC1-*a*, may be supplied with a pre-set voltage. When the first substrate of FIG. 1 is sectioned along A-A', the first channel LC1-*a* is divided by a greater number, but for ease of illustration, the first channel LC1-*a* is divided by a smaller number.

Referring to FIG. 3, second grooves may be formed on the second groove-formed substrate 200-H. The second flat substrate 200-F may be adhered to the second groove-formed substrate 200-H so that the second grooves are blocked from outside, and second holes are formed on the second flat substrate 200-F. Second electrodes may be inserted into the second holes. For ease of illustration, it may be assumed that the actual locations of C and C' within the device correspond to the locations of D and D', and that only $b^{th}$ (where b is a natural number) second channel LC2-*b* among all second channels is shown here. Therefore, in FIG. 3, a second hole H2-*b* among all the second holes is shown as a representative of the second holes, and a second electrode EC2-*b* among all the second electrodes is shown a representative of the second holes. The second electrode EC2-*b* may be arranged between the second flat substrate 200-F and the third substrate 300.

The touch sensor described with reference to FIGS. 1 to 3 may detect touch in various ways. For example, when conductive material is touched, capacitance may be changed by the touch. Even when the same voltage is supplied by the first electrodes by changes in capacitance, levels of current or voltage measured by the second electrodes may be changed. In other words, a touch sensor in accordance with an exemplary embodiment may detect changes in current or voltage incurred by touch by conductive material. In addition, when pressure is applied to the touch sensor, the thickness T3 in the third direction of the point on the third substrate 300 on which the pressure is applied may be changed, and the gap between the first channels LC1 and the second channels LC2 may be changed. Capacitance may be changed due to changes in the gap, and thus, levels of current or voltage measured by the first electrodes and the second electrodes may be changed. In other words, a touch sensor in accordance with an exemplary embodiment may detect changes in current or voltage incurred by pressure. When a touch sensor in accordance with an exemplary embodiment is used, if it is lightly touched by conductive material and the capacitance is changed, or if, regardless of material, the thickness of the point on the third substrate 300 on which pressure is applied is changed by the pressure, the location of the touch, or the location of the point where the thickness has been changed, may be calculated. When the second substrate 200 shown in FIG. 1 is sectioned along D-D', the second channel LC2-*b* may be divided by a greater number, but for ease of illustration, the second channel LC2-*b* is divided by a smaller number.

Figure 4A:
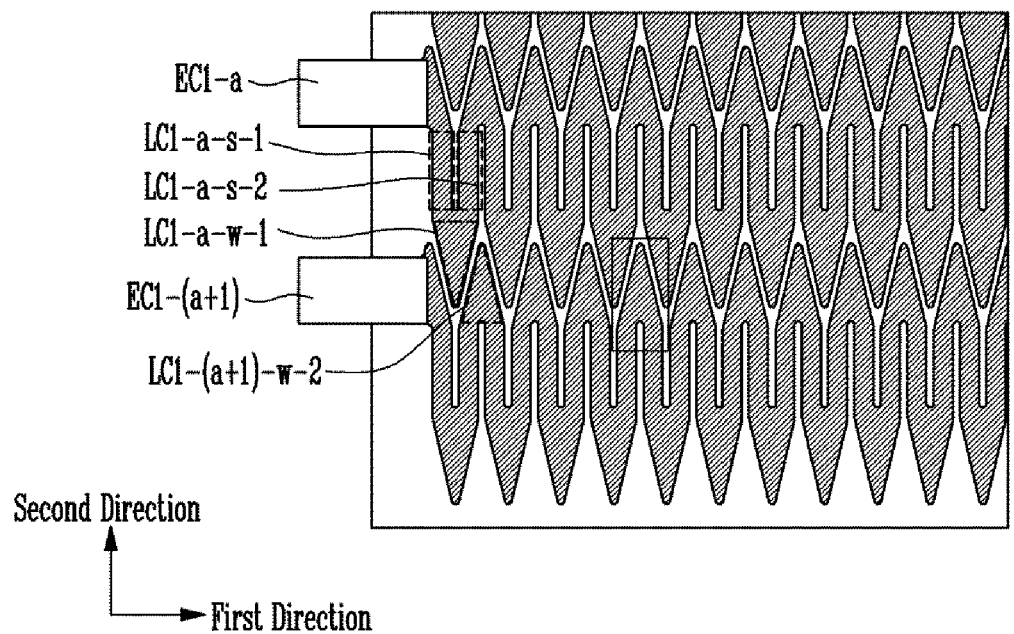
FIG. 4A, FIG. 4B, and FIG. 5 are plan views illustrating an exemplary embodiment of a structure of first channels and second channels of the touch sensor shown in FIG. 1.
Figure 4B:
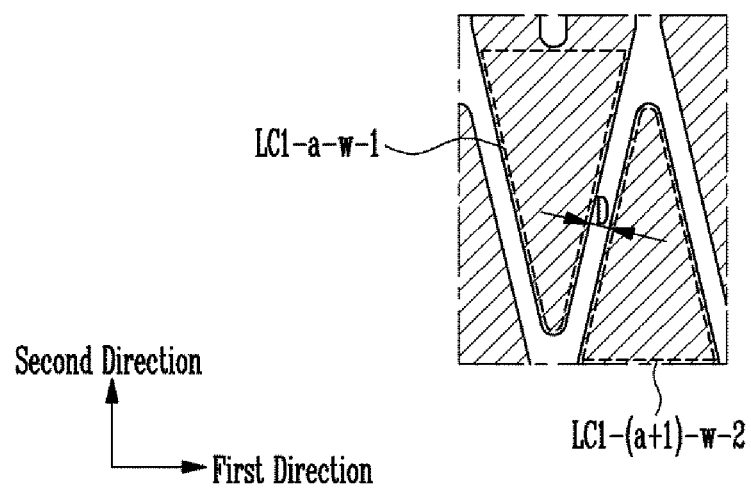
Figure 5:
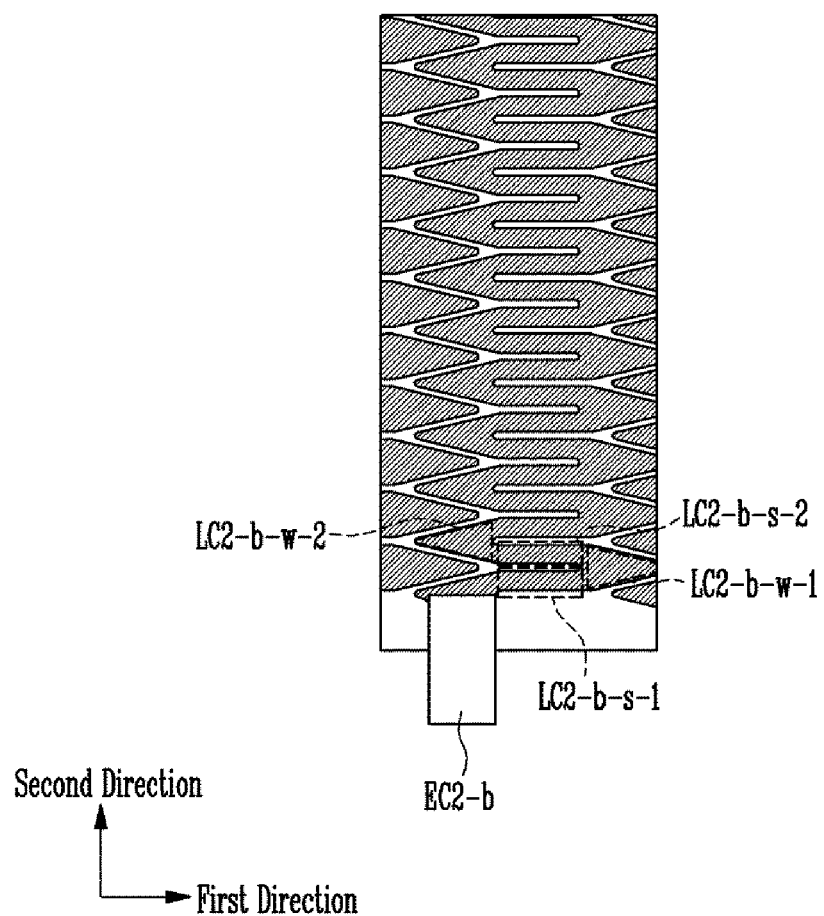

FIGS. 4A, 4B, and 5 are plan views for describing an exemplary embodiment of a structure of the first channels and the second channels of the touch sensor of FIG. 1. FIGS. 4A and 4B are plan views illustrating an exemplary embodiment of a structure of the first channels of the touch sensor shown in FIG. 1, and FIG. 5 is a plan view for illustrating an exemplary embodiment of a structure of the second channels of the touch sensor of FIG. 1.

In FIGS. 4A and 4B, only two neighboring first channels among all the first channels are shown for ease of illustration. The first channel LC1-*a* may include a plurality of straight channels and wedges, and for ease of illustration, only straight channels LC1-*a*-*s*-1 and LC1-*a*-*s*-2 and a wedge LC1-*a*-*w*-1 will be given as examples. Also, regarding the first channel LC1-(*a*+1), only the wedge LC1-(*a*+1)-*w*-2 will be explained. The straight channels LC1-*a*-*s*-1 and LC1-*a*-*s*-2 may extend in the second direction. In addition, the wedge LC1-*a*-*w*-1 of the first channel LC1-*a* and the wedge LC1-(*a*+1)-*w*-2 of the first channel LC1-(*a*+1), which are adjacent to each other, may be separated by a distance D. The wedge LC1-*a*-*w*-1 may be a first wedge, and the wedge LC1-*a*+1-*w*-2 may be a second wedge. The distance D may be equal to or greater than 150 µm and less than or equal to 200 µm. When the distance D is less than 150 µm, the distance between the side walls between the first channel LC1-*a* and the second channel LC1-(*a*+1) may become undesirably short, increasing the chance for the touch sensor to easily break. When the distance D is greater than 200 µm, the accuracy of the touch sensor may decrease. The wedge LC1-*a*-*w*-1 will be explained in more detail with reference to FIG. 6.

In FIG. 5, only the second channel LC2-*b* among all the second channels is shown for ease of illustration. The second channel LC2-*b* may include multiple straight channels and wedges, but for ease of illustration, only straight channels LC2-*b*-*s*-1 and LC2-*b*-*s*-2 and wedges LC2-*b*-*w*-1 and LC2-*b*-*w*-2 will be given as examples. The straight channels LC2-*b*-*s*-1 and LC2-*b*-*s*-2 may extend in the first direction.

Figure 6:
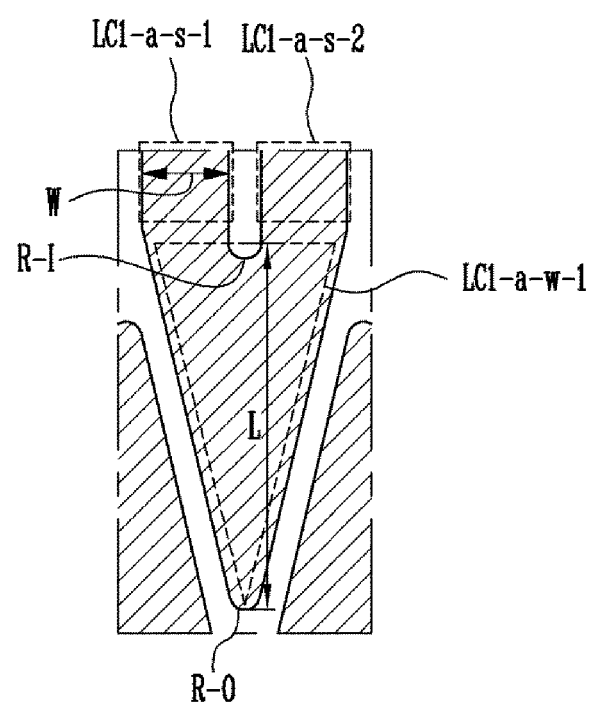
FIG. 6 is a plan view illustrating an exemplary embodiment of a structure of a wedge of the first channel shown in FIG. 4.

FIG. 6 is a plan view for describing an exemplary embodiment of a structure of a wedge of the first channel shown in FIG. 4.

In FIG. 6, only straight channels LC1-*a*-*s*-1 and LC1-*a*-*s*-2 and a wedge LC1-*a*-*w*-1 are shown. The straight channel LC1-*a*-*s*-1 may have a width in the first direction, and the width may be equal to or greater than 80 µm and less than or equal to 300 µm. The wedge LC1-*a*-*w*-1 may include a round part, and the round part may include an inner round portion R-I and an outer round portion R-O. The contact angle may be defined as the angle formed between a surface of a solid and a liquid when the liquid is in contact with the surface of the solid, and its value may be changed depending on the kind of conductive liquid and material making up the first substrate. When the wedge LC1-*a*-*w*-1 does not have an outer round portion R-O, slopes of the wedge LC1-*a*-*w*-1 may meet, forming an angle greater than 0 degrees (e.g., 22 to 45 degrees). If this angle is less than the contact angle between the first channels and the first conductive liquid, not all of the conductive liquid may be injected into the interface, and bubbles may be formed in the first channels. When bubbles are in the channels, the amount of the conductive liquid may decrease, leading to a reduced sensitivity to touch and possible destruction of the touch sensor due to the bubbles. However, as a wedge LC1-*a*-*w*-1 has an outer round portion R-O, slopes of the wedge LC1-*a*-*w*-1 may not meet forming an angle greater than 0 degrees. In addition, because the wedge LC1-*a*-*w*-1 has an inner round portion R-I, the interface where the straight channels LC1-*a*-*s*-1 and LC1-*a*-*s*-2 and the wedge LC1-*a*-*w*-1 may not form an angle greater than 0 degrees (for example, 22 to 45 degrees). Therefore, all the conductive liquid may be injected into the interface, so no bubbles may form in the channels. All of the conductive liquid may be injected into the inner round portion R-I, and it may be injected into the outer round portion R-O when certain requirements for the radius of curvature (ROC) of the outer round portion R-O are met. In other words, wedges with round shapes may be included, and conductive liquid may be injected into that channel, so sensitivity to touch may be improved by the wedge, but there may be no damage to the substrate as there are no bubbles in the channel.

The wedge LC1-a-w-1 may have a length L in the second direction. When the length L is less than 150 μm, channel resistance may increase causing RC delay to worsen, and when the length L is greater than 600 μm, the round part may become excessively large, causing channel sensitivity to decrease.

When the ROC is less than half of the width W of the straight channels LC1-a-s-1 and LC1-a-s-2, the outer round portion R-O may be excessively bent, which may cause all of the conductive liquid not to be injected into the outer round portion R-O, leading to the formation of bubbles. When there are bubbles present, the detecting sensitivity of the entire touch sensor may be decreased, and the touch sensor may be damaged. When the ROC of the outer round portion R-O is greater than 63% of the width W of the straight channels LC1-a-s-1 and LC1-a-s-2, the outer round portion R-O may become too flat, the length of the channels may be increased, leading to an increase in resistance. As a result, the sensitivity of the touch sensor may be decreased. In other words, the ROC of the outer round portion R-O may be expressed as the equation below:

$$0.5 \times W \leq ROC{-}O \leq 0.63 \times W \qquad \text{[Equation 1]}$$

(W: width of the straight channel LC1-a-s-1, ROC–O: ROC of the outer round portion R-O)

Figure 13:
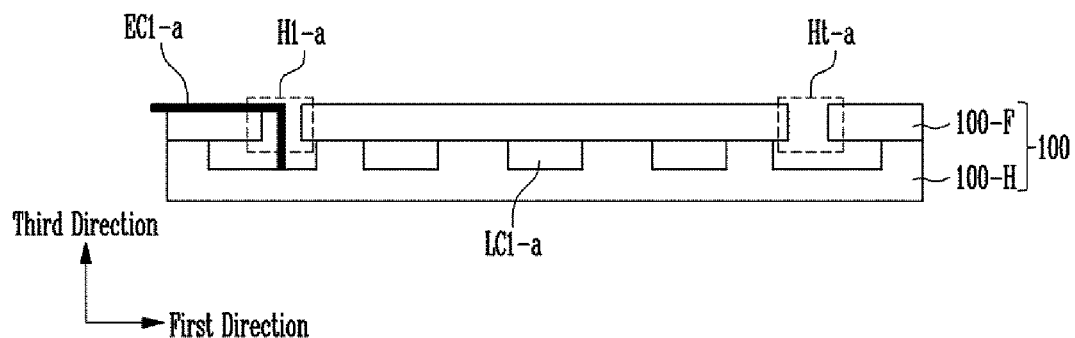
Figure 14:
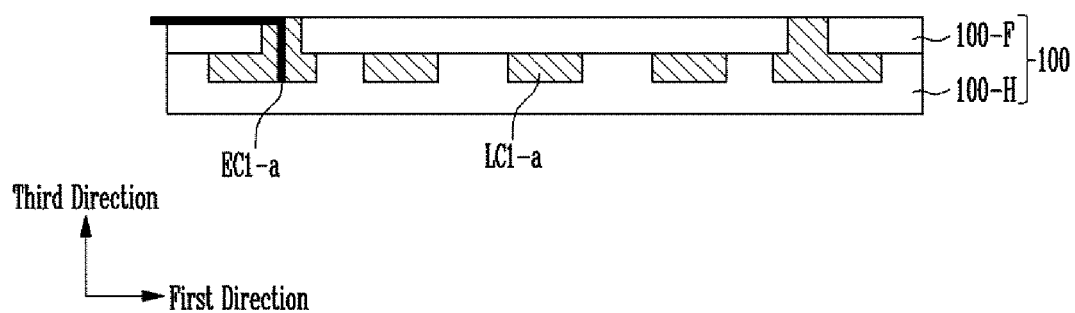
Figure 15:
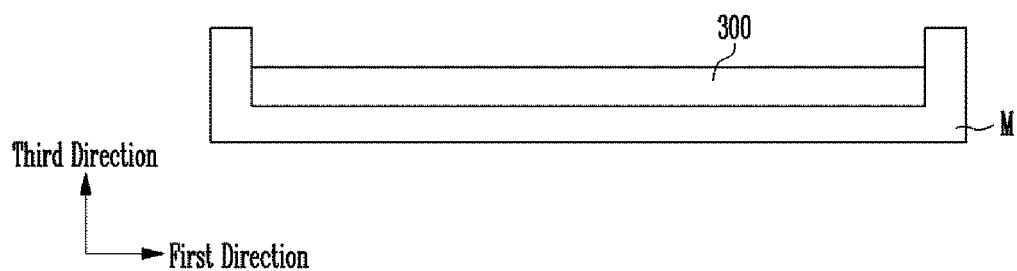
Figure 16:
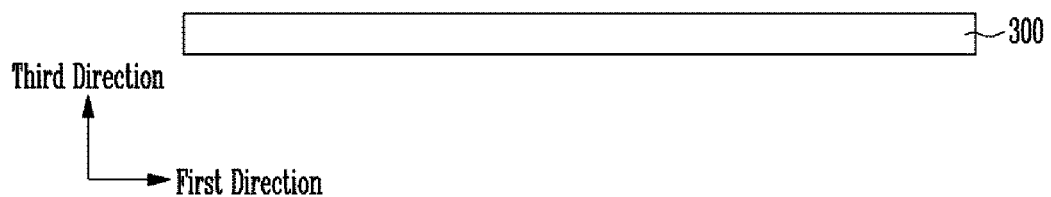

FIGS. 7 to 17 are cross-sectional views for describing a method of manufacturing the touch sensor shown in FIG. 1. FIGS. 7 to 14 are cross-sectional views for describing a method of manufacturing the first substrate, and FIGS. 15 and 16 are cross-sectional views for describing a method of manufacturing the third substrate. A method of manufacturing the second substrate may be described with reference to FIGS. 7 to 14.

Figure 7:
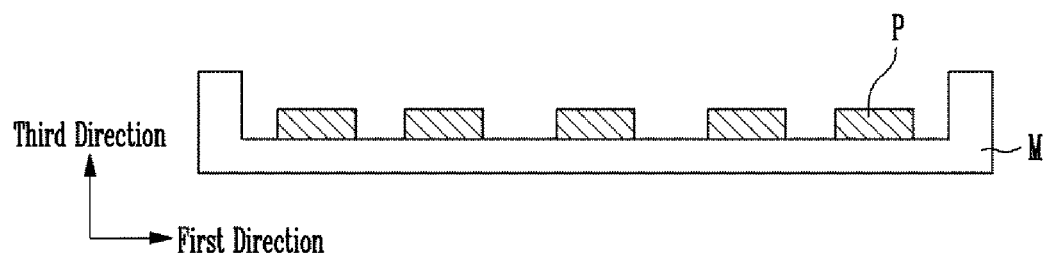
FIG. 7, FIG. 8, FIG. 9, FIG. 10, FIG. 11, FIG. 12, FIG. 13, FIG. 14, FIG. 15, FIG. 16, and FIG. 17 are cross-sectional views for describing a method of manufacturing the touch sensor shown in FIG. 1.

FIG. 7 illustrates steps in forming first protrusions P on a mold M. The shape of the first protrusions P may correspond to the shape of the first channels LC1 and the shape of the first grooves of the first groove-formed substrate 100-H, and the material making up the protrusions P may be a material that is photosensitive and stackable to a substantial thickness. For example, SU-8, etc., may be included. The mold M may take the shape of a container later in order to hold fluid.

Figure 8:
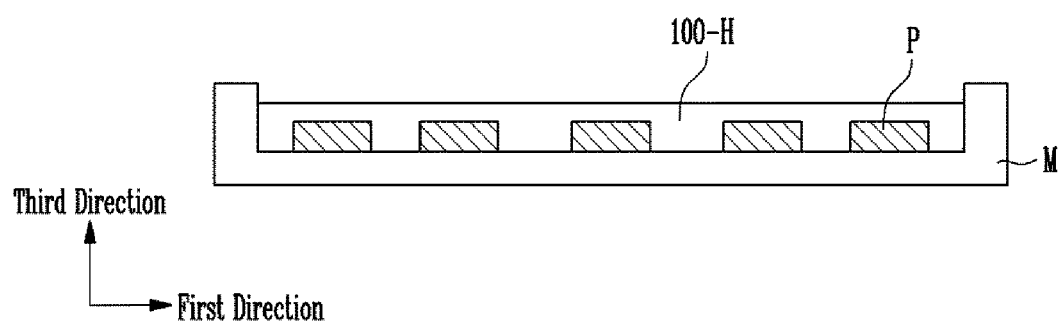

FIG. 8 illustrates a step in which material making up the first groove-formed substrate 100-H is injected into a mold M with the first protrusions P formed on it, is hardened, and forms the first groove-formed substrate 100-H. Material making up the first groove-formed substrate 100-H, for example polydimetylsiloxane (PDMS), may flow and be included as a liquid, However, if heat, ultraviolet rays, etc. are applied, material making up the first groove-formed substrate 100-H may be hardened (curing). The first groove-formed substrate 100-H may be formed by putting the material making up the first groove-formed substrate 100-H into a mold M with the shape of a container and with the first protrusions P formed on it and hardening using the eternal environment (heat, ultraviolet rays, etc.). In other words, it may be hardened as the first grooves corresponding to the first protrusions P are formed.

Figure 9:
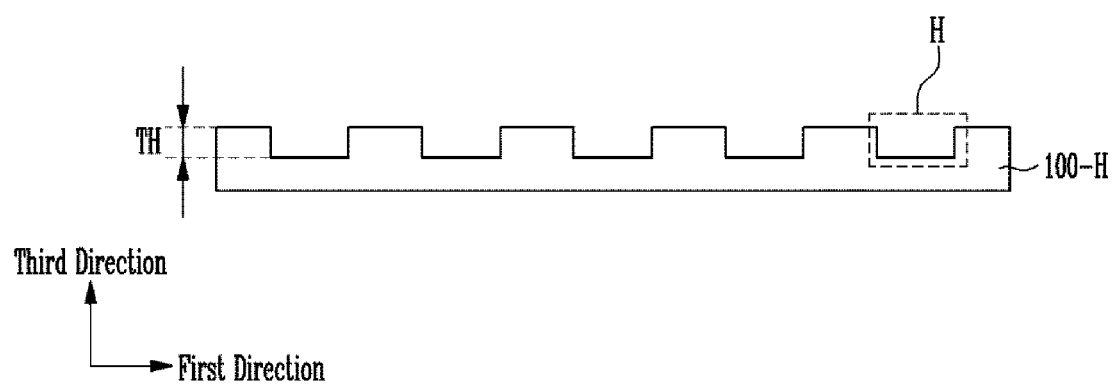

FIG. 9 illustrates a step in which the first groove-formed substrate 100-H is detached from the mold M. Applying external force onto the first groove-formed substrate 100-H may separate the mold M from the first groove-formed substrate 100-H, and the protrusions from the first groove-formed substrate 100-H. The steps shown in FIGS. 7 to 9 may correspond to the steps of forming the first groove-formed substrate 100-H. The first grooves H of the first groove-formed substrate 100-H may correspond to the shape of the first protrusions P, and the thickness TH in the third direction of the first grooves H may correspond to the height in the third direction of the first channels LC1.

Figure 10:
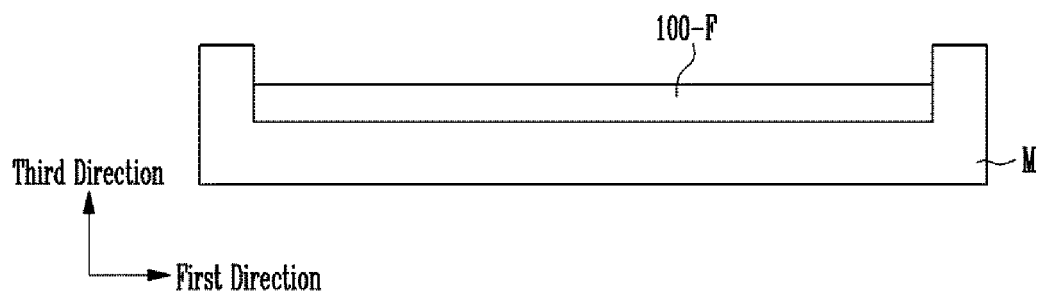

FIG. 10 illustrates a step in which liquid material making up the first flat substrate 100-F is poured into the mold M and is hardened. Material making up the first flat substrate 100-F may possess the same characteristics as material making up the first groove-formed substrate 100-H. Thus, repeated description may be omitted. The first flat substrate 100-F may be formed by pouring the material making up the first flat substrate 100-F into the mold M having the shape of a container and by hardening it by the external environment (heat, ultraviolet rays, etc.) Because the surface of the mold M touching material making up the first groove-formed substrate does not have any protrusions or grooves, the first flat substrate 100-F may have a flat shape.

Figure 11:
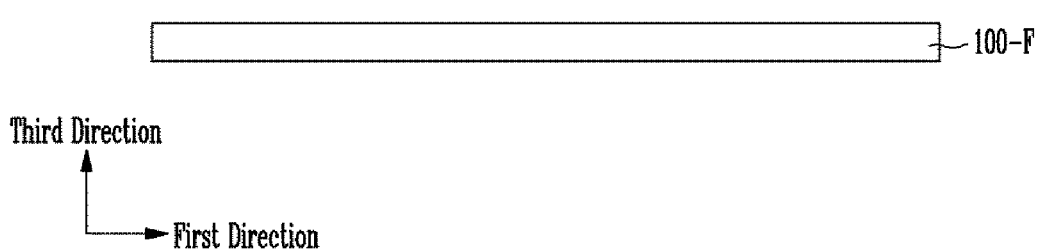

FIG. 11 illustrates a step in which the first flat substrate 100-F is detached from the mold M. Just like in the case of the first groove-formed substrate 100-H, application of external force onto the first flat substrate 100-F may separate the mold M and the first flat substrate 100-F. The steps shown in FIGS. 10 and 11 may correspond to the step in which the first flat substrate is formed.

Figure 12:
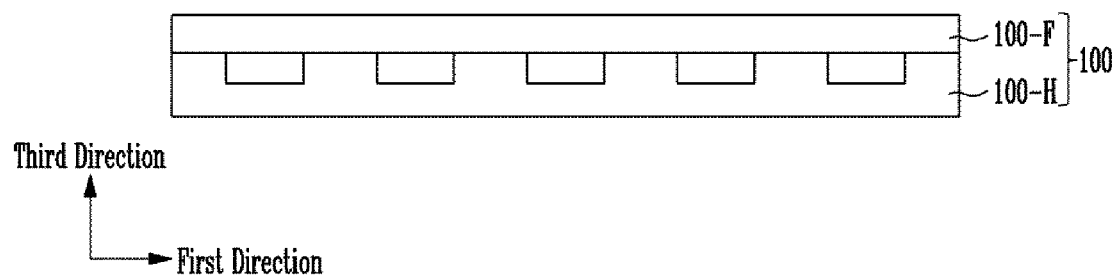

FIG. 12 illustrates a first adherence step in which the first groove-formed substrate 100-H and the first flat substrate 100-F are adhered together to form the first substrate with the first channels formed on it. The first groove-formed substrate 100-H and the first flat substrate 100-F may be arranged in such a way that they are touching each other, applied heat to, and adhered together. Or the surface of the first groove-formed substrate 100-H which is to be attached and the surface of the first flat substrate 100-F which is to be attached may be applied with material making up the first groove-formed substrate 100-H before it is hardened. When heat or ultraviolet rays are applied, the material making up the first groove-formed substrate 100-H may be hardened, and the first groove-formed substrate 100-H and the first flat substrate 100-F may be adhered together. Alternatively, when material making up the first groove-formed substrate 100-H and material making up the first flat substrate 100-F are the same, the surfaces of the first groove-formed substrate 100-H and the first flat substrate 100-F may be oxygen plasma-treated, and the first groove-formed substrate 100-H and the first flat substrate 100-F may be arranged in such a way that they are touching each other. When the oxygen plasma-treated surfaces of the first groove-formed substrate 100-H and the first flat surface 100-F touch each other, the first groove-formed substrate 100-H and the first flat substrate 100-F may be adhered together. The first channels LC1 may be formed by the first groove-formed substrate 100-H and the first flat substrate 100-F being adhered together.

FIG. 13 illustrates a step in which first holes and temporary holes are formed in the first channels LC1, and first electrodes are inserted into the first holes. The first holes and the temporary holes may be formed in the first channels, and the first electrodes may be inserted into the first holes. Because only the $a^{th}$ first channel LC1-a is shown in FIG. 13, only a first hole H1-*a* among all the first holes is shown, only a temporary hole HT-*a* among all the temporary holes is shown, and only a first electrode EC1-*a* among all the first electrodes is shown in the figure. Also, in accordance with an exemplary embodiment, the temporary holes may not be formed. In FIG. 13, the first electrode EC1-*a* may not be fixed with respect to the first substrate 100. In addition, tubes (not shown) may be inserted into the first and temporary holes to inject the first conductive liquid into or to take air out of the first channels LC1. In this case, the first electrode EC1-*a* may be provided within one of the tubes.

FIG. 14 illustrates a step in which the first conductive liquid is injected into the first channels through the first holes and gas is taken out of the first channels through the temporary holes. For ease of illustration, explanations only regarding the first channel LC1-*a* among all the first channels LC1 will be given. The first conductive liquid from one of the tubes inserted into the first hole H1-*a* may be injected into the first channel LC1-*a*. Concurrently, the air existent in the first channel LC1-*a* may be taken out of the first channel LC1-*a* through one (not shown) of the tubes inserted into the temporary hole HT-a. When using this method, no air may be left in the first channels LC1, making preventing the lowering of the sensitivity of the touch sensor and damage to the touch sensor due to bubbles.

FIGS. 15 and 16 illustrate a method of manufacturing the third substrate.

FIG. 15 illustrates a step in which liquefied material making up the third substrate 300 is poured into the mold and hardened. Since this is very similar to the step described with reference to FIG. 10, in which liquefied material making up the first flat substrate 100-F is poured and hardened is very similar, the description thereof will be omitted. Material making up the third substrate 300 and capable of being included in fluid may be put into a mold M with the shape of a container and hardened by the external environment (heat, ultraviolet rays, etc.) to form the third substrate 300. In accordance with an exemplary embodiment, even when the material making up the first substrate 100, the second substrate 200, and the third substrate 300 may be the same, as the third substrate 300 is porous, the elastic modulus of the third substrate 300 may be lower than those of the first substrate 100 and the second substrate 200. Particularly, the material making up the third substrate 300 (for example, PDMS) may be poured into the mold M and stirred around to form foam. In order to form foam, other material (for example, water) may additionally be injected into the mold M. Hardening material with foam formed may lead to the formation of a porous third substrate 300.

FIG. 16 illustrates a step in which the third substrate 300 is separated from the mold M. As in the case of the first groove-formed substrate 100-H, the mold M and the third substrate 300 may be separated by applying external force to the third substrate 300.

Figure 17:
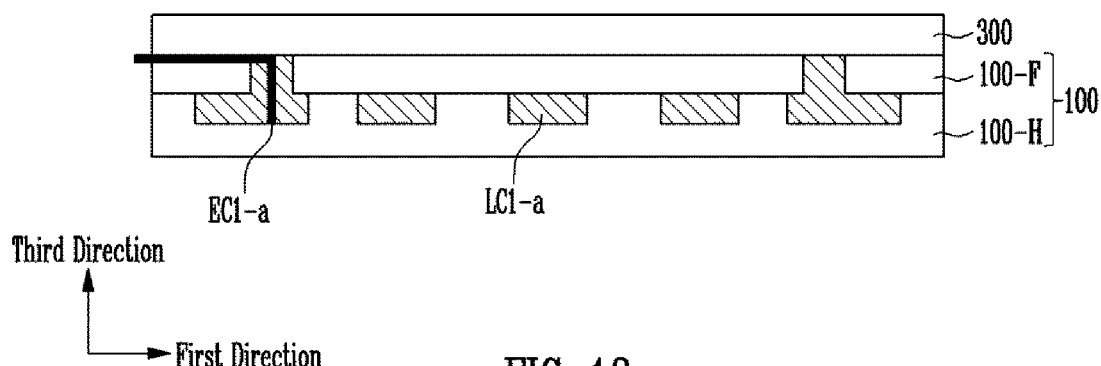

FIG. 17 illustrates a third adhesion step in which the first substrate and the third substrate are adhered together. When material making up the first substrate 100 and the third substrate 300 is the same, the first substrate 100 and the third substrate 300 may be adhered together through the methods described with reference to FIG. 12. The first and the temporary holes may be isolated from outside by the third substrate 300. In other words, the first conductive liquid injected into the first channels LC1 may not come outside.

After FIG. 17, the third substrate 300 and the second substrate 200 may be adhered together through the methods described with reference to FIG. 12. The second holes may be isolated from outside by the third substrate 300. In other words, the second conductive liquid injected into the second channels LC2 may not come outside. After the adhesion of the third substrate 300 and the second substrate 200, the touch sensor shown in FIGS. 1 to 3 may be obtained. It may be desirable for the first channels LC1 to extend in the first direction and for the second channels LC2 to extend in the second direction which crosses the first direction. If the third substrate 300 and the second substrate 200 are adhered together, the touch sensor described with reference to FIGS. 1 to 3 may be completed.

Figure 18:
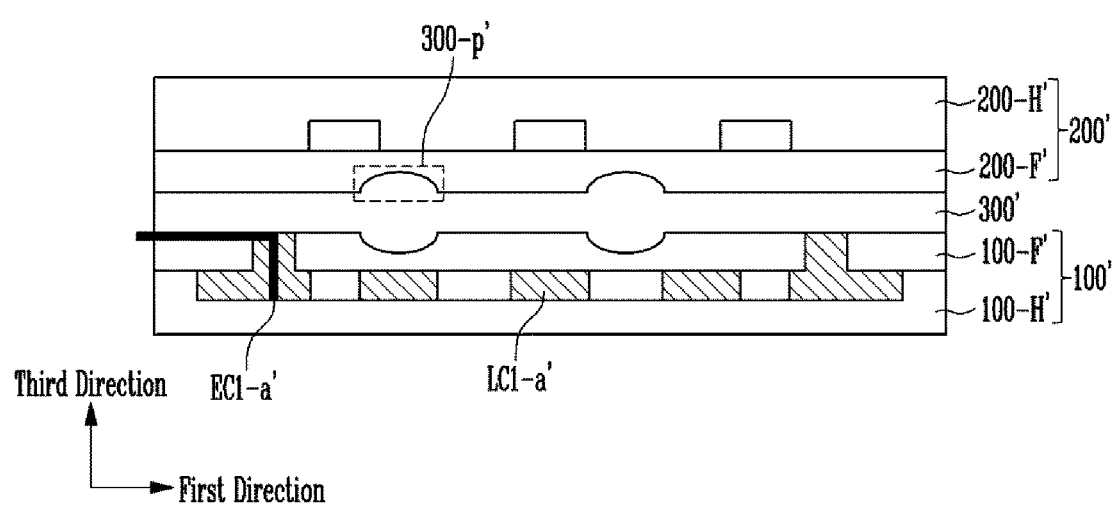
FIG. 18 is a cross-sectional view for describing a touch sensor in accordance with another exemplary embodiment.

FIG. 18 is a cross-sectional view for describing illustrates a touch sensor in accordance with another exemplary embodiment. The touch sensor may include a first substrate 100', a second substrate 200', and a third substrate 300'. The third substrate 300' of the touch sensor shown in FIG. 18, unlike the one shown in FIG. 2 and FIG. 3, may include protrusions 300-*p*'. When the elastic modulus of the third substrate 300 is lower than those of the first substrate 100 and the second substrate 200, and when the third substrate 300' includes protrusions 300-*p*', the degree that the protrusions 300-*p*' are morphed may be greater than that to which the $a^{th}$ first channel LC1-*a*' is morphed, even if pressure is applied to the touch sensor. Therefore, the chance of a short circuit due to blockage in channels may decrease as the degree to which the first channels LC1-*a*' are morphed is reduced, even if the pressure is applied.

Figure 19:
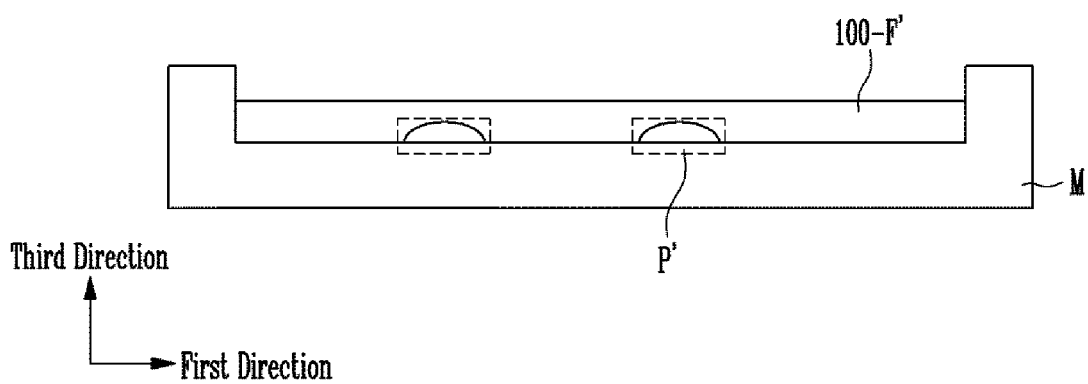
FIG. 19 is cross-sectional views for describing a method of manufacturing a first flat substrate among the touch sensor shown in FIG. 18.

FIG. 19 is cross-sectional views for describing a method of manufacturing the first flat substrate of the touch sensor of FIG. 18. Unlike FIG. 10, protrusions P' may be formed on the mold M, and the material making up the first flat substrate 100-F and which may belong to liquid may be injected and hardened. Grooves may be formed on the first flat substrate 100-F', and the shape of the grooves may correspond to the protrusions P'.

Figure 20:
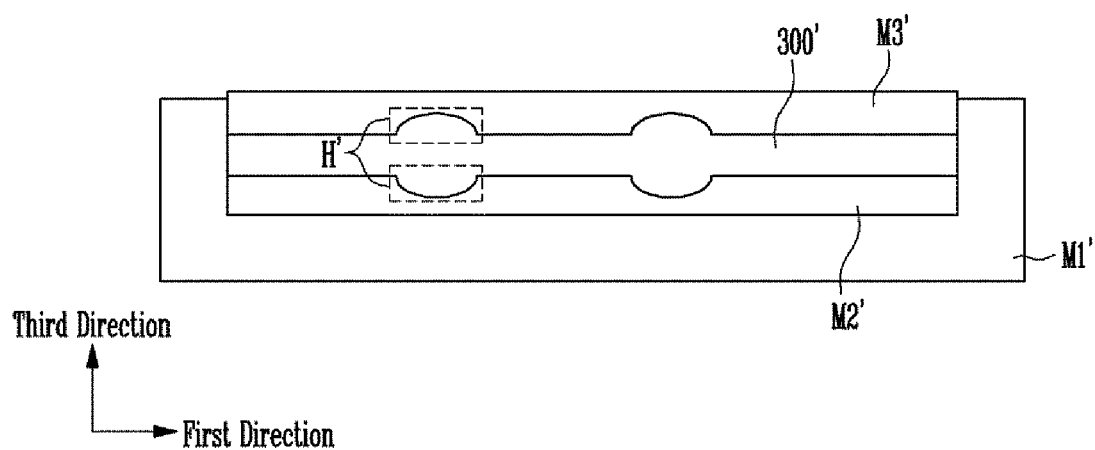
FIG. 20 and FIG. 21 are cross-sectional views for describing a method of manufacturing a third substrate among the touch sensor shown in FIG. 18.
Figure 21:
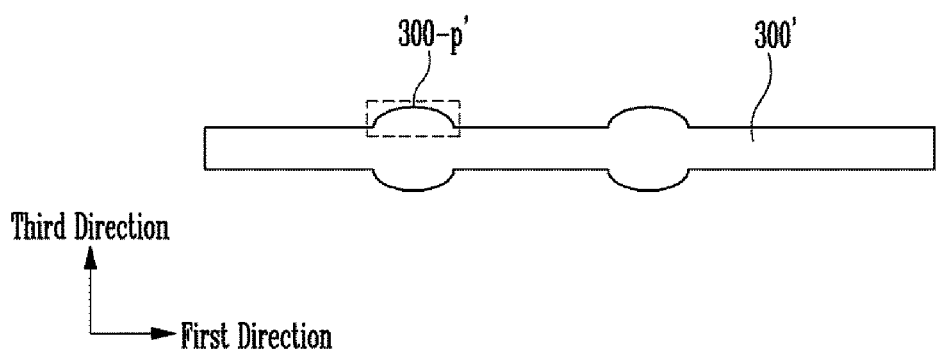

FIG. 20 and FIG. 21 illustrate how to manufacture the third substrate of the touch sensor of FIG. 18.

FIG. 20 illustrates a step in which material making up the third substrate 300 is injected between molds M2' and M3' with grooves formed on them and hardened to form the third substrate. The material making up the third substrate 300' may be injected among a fixing mold M1' and molds M2' and M3' with grooves H' formed on them. Thereafter, when forming the third substrate 300' by hardening the material, the protrusions corresponding to the grooves H' may be formed on the third substrate 300'.

FIG. 21 illustrates a step in which the third substrate 300' is separated from the molds M2' and M3'. As described with reference to FIG. 9, due to applying external force upon the third substrate 300', the third substrate 300' may be separated from the molds M1', M2', and M3'.

In addition to the methods described above, there are other methods which may be employed to form a third substrate with protrusions 300-*p*' formed on it. For example, as described with reference to FIGS. 15 and 16, grooves may be formed after manufacturing the third substrate.

Figure 22:
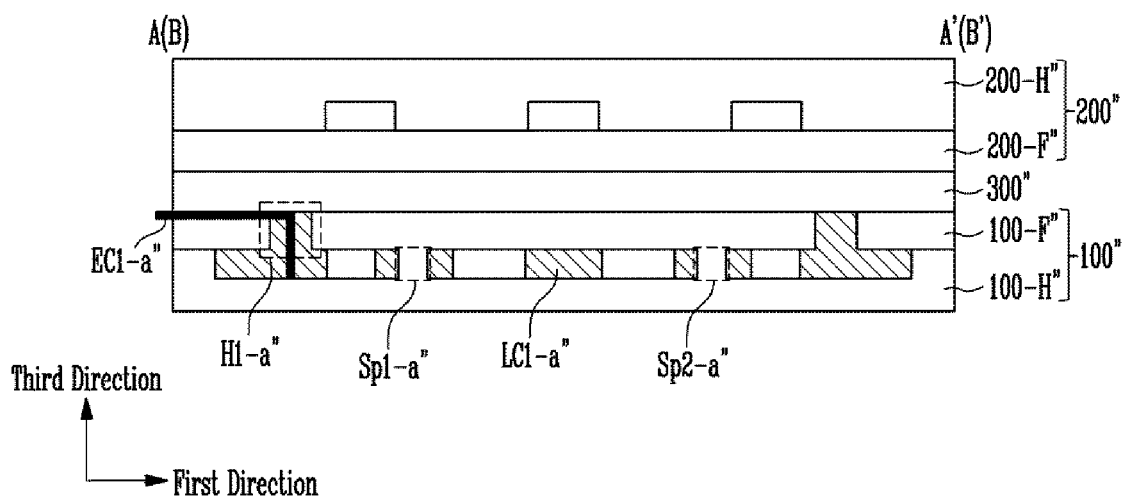
FIG. 22 is a cross-sectional view for describing a touch sensor in accordance with another exemplary embodiment.

FIG. 22 is a cross-sectional view for describing a touch sensor in accordance with another exemplary embodiment. In a touch sensor with reference to FIG. 22, the first groove-formed substrate 100-H" may include spacers Sp1-*a*" and Sp2-*a*". Because the spacers Sp2-*a*" and Sp2-*a*" restrict the morphing of the first channels LC1-*a*", short-circuiting of channels due to excessive applied pressure may be prevented. Also, when pressure is applied to the touch sensor, the amount of change in the thickness of the third substrate 300" may be greater than that of change in the thickness of the first substrate 100" or the second substrate 200". Therefore, the gap between the first channels and the second channels may greatly be changed. Thus the sensitivity to changes in the level of current of voltage incurred by pressure may be increased compared to the touch sensor shown in FIG. 1.

Figure 23:
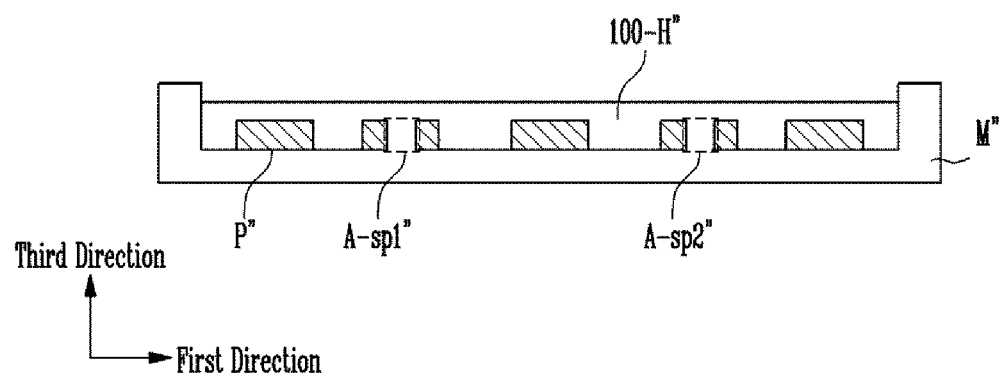
FIG. 23 and FIG. 24 are cross-sectional views for describing a method of manufacturing the first groove-formed substrate of the touch sensor shown in FIG. 22.
Figure 24:
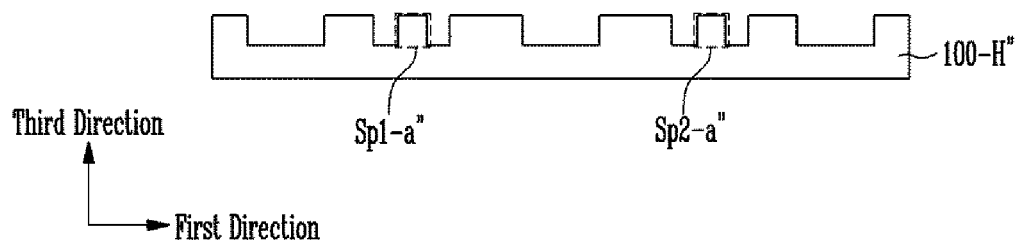

FIGS. 23 and 24 are cross-sectional views illustrating some of the methods to manufacture the first groove-formed substrate of the touch sensor of FIG. 22.

FIG. 23 illustrates a step in which material making up the first groove-formed substrate 100-H″ is injected and hardened to form the first groove-formed substrate 100-H″. FIG. 23 is mostly identical to FIG. 8. It is different only in that first protrusions P″ are not formed in the part corresponding to the spacers A-sp1″ and A-sp2″.

FIG. 24 illustrates a step in which a first groove-formed substrate 100-H″ is separated from a mold M″. FIG. 24 is similar to FIG. 9, and differs only in that spacers SP1-a″ and SP2-a″ are formed.

Exemplary embodiments provide a touch sensor and a method of manufacturing the same which form channels that cross each other on a stretchable substrate, each of the channels including a wedge having a round form. Because a conductive liquid is injected into the channel, touch sensitivity may increase due to the wedge, but because there are no bubbles in the channel, damage to the substrate may be prevented.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A touch sensor comprising:
a first stretchable substrate comprising first channels extended in a first direction;
a first conductive liquid injected into the first channels;
a second stretchable substrate comprising second channels extended in a second direction crossing the first direction; and
a second conductive liquid injected into the second channels,
wherein:
at least one of the first channels or the second channels comprises straight lines and wedges, and at least one of the wedges comprises a round part;
the round part comprises an inner concave round portion and an outer convex round portion; and
a radius of a curvature of the outer round portion is expressed in an equation below:

$$0.5 \times W \leq ROC\text{-}O \leq 0.63 \times W$$

(where W is at least one width of the straight lines and ROC–O is the radius of the curvature of the outer round portion).

2. The touch sensor as claimed in claim 1, wherein:
two adjacent first channels among the first channels comprise a first wedge and a second wedge, respectively;
the first wedge and the second wedge are adjacent to each other;
at least one of a length in the second direction of the first wedge and the second wedge is greater than or equal to 150 μm and less than or equal to 600 μm; and
a distance between the first wedge and the second wedge is greater than or equal to 150 μm and less than or equal to 200 μm.

3. The touch sensor as claimed in claim 1, wherein the touch sensor further comprises:
first electrodes inserted into first holes formed at one end of the first channels; and
second electrodes inserted into second holes formed at one end of the second channels,
wherein:
a voltage having a preset level is supplied to at least one of the first channels;
at least one level of current or voltage among the second electrodes is changed due to a change in capacitance when a conductive material touches the touch sensor; and
a touch position is detected based on the change in level of the current or voltage.

4. The touch sensor as claimed in claim 3, wherein:
the touch sensor further comprises a third stretchable substrate disposed between the first stretchable substrate and the second stretchable substrate; and
the third substrate blocks the first holes and the second holes from outside.

5. The touch sensor as claimed in claim 4, wherein:
the third stretchable substrate has a thickness in a third direction crossing the first direction and the second direction; and
when an external force is applied to the touch sensor, the capacitance between the first conductive liquid and the second conductive liquid changes as a result of the change in the thickness, the level of current or voltage measured by the first electrodes or the second electrodes is changed as a result of the change in the capacitance, and the touch position is detected based on the change in the level of the current or voltage.

6. The touch sensor as claimed in claim 4, wherein:
a material forming at least one of the first stretchable substrate to the third substrate comprises at least one from a group consisting of polydimethylsiloxane (PDMS) or polyurethane; and
a material forming at least one of the first conductive liquid or the second conductive liquid includes at least one from a group consisting of gallium (Ga) or indium (In).

7. The touch sensor as claimed in claim 4, wherein:
an elastic modulus of the third substrate is lower than an elastic modulus of the first substrate and an elastic modulus of the second substrate; and
the third substrate is porous.

8. The touch sensor as claimed in claim 4, wherein the third substrate comprises a protrusion.

9. The touch sensor as claimed in claim 3, wherein:
the first stretchable substrate comprises:
a first groove-formed substrate comprising first grooves that are a portion of the first channels; and
a first flat substrate attached to the first groove-formed substrate and configured to block the first grooves from outside and comprising the first holes; and
the second substrate comprises:
a second groove-formed substrate comprising second grooves that are a portion of the second channels; and
a second flat substrate attached to the second groove-formed substrate and configured to block the second grooves from outside and comprising the second holes.

10. The touch sensor as claimed in claim 9, wherein at least one of the first groove-formed substrate and the second groove-formed substrate further comprises a spacer configured to restrict morphing of the first channels or the second channels.

11. A method for manufacturing a touch sensor, the method comprising:
forming a first groove-formed substrate comprising first grooves;
forming a first flat substrate;
forming a first substrate comprising first channels corresponding to the first groove by attaching the first groove-formed substrate and the first flat substrate; and
injecting a first conductive liquid into the first channels,
wherein:
at least one of the first channels comprises straight lines and wedges, each of the wedges comprising a round part;
the round part comprises an inner concave round portion and an outer convex round portion; and
a radius of a curvature of the outer round portion is expressed in an equation below:

$$0.5 \times W \leq ROC\text{-}O \leq 0.63 \times W$$

(where W is at least one width of the straight lines and ROC–O is the radius of the curvature of the outer round portion).

12. The method as claimed in claim 11, wherein the forming of the first groove-formed substrate comprises:
forming the first groove-formed substrate;
forming first protrusions on a mold;
injecting a material forming the first groove-formed substrate into the mold comprising the first protrusions;
forming the first groove-formed substrate by hardening the injected material; and
separating the first groove-formed substrate and the mold, wherein a shape of the first protrusions corresponds to the first grooves.

13. The method as claimed in claim 11, further comprising:
forming a second groove-formed substrate comprising second grooves;
forming a second flat substrate;
forming a second substrate comprising second channels corresponding to the second groove by attaching the second groove-formed substrate and the second flat substrate;
injecting a second conductive liquid into the second channels; and
fixing the first substrate onto the second substrate,
wherein, in the fixing, the first channels and the second channels are fixed such that the first channels extend in a first direction and the second channels extend in a second direction crossing the first direction.

14. The method as claimed in claim 13, wherein:
the fixing comprises:
forming a third substrate;
attaching the first substrate and the third substrate; and
attaching the third substrate and the second substrate; and
the third substrate has a thickness in a third direction crossing the first direction and the second direction; and
when the thickness is changed by an external force, a capacitance between the first conductive liquid and the second conductive liquid is changed.

15. The method as claimed in claim 14, wherein the forming of the third substrate comprises:
injecting a material forming the third substrate into a mold and forming bubbles;
forming the third substrate by hardening the material; and
separating the third substrate from the mold.

16. The method as claimed in claim 14, wherein the forming of the third substrate comprises:
injecting a material forming the third substrate between molds comprising grooves;
forming the third substrate by hardening the material; and
separating the third substrate from the molds.

17. The method as claimed in claim 14, wherein the injecting of the first conductive liquid comprises:
forming first holes at one end of the first channels, forming temporary holes at the other end of the first channels, and inserting first electrodes into the first holes; and
injecting the first conductive liquid into the first channels through the first holes and discharging gas in the first channels through the temporary holes.

18. The method as claimed in claim 17, wherein, in the attaching of the first substrate and the third substrate, the first holes are blocked from outside by the third substrate.

* * * * *